United States Patent [19]

Wroblewski et al.

[11] Patent Number: 4,692,933

[45] Date of Patent: Sep. 8, 1987

[54] ELECTRO-MECHANICAL INTEGRATOR

[75] Inventors: David J. Wroblewski, Willoughby; John W. Robertson, Jr., Chesterland, both of Ohio

[73] Assignee: The Babcock & Wilcox Company, New Orleans, La.

[21] Appl. No.: 843,369

[22] Filed: Mar. 24, 1986

[51] Int. Cl.[4] .................... H03K 21/02; H03K 21/18; G01R 23/10

[52] U.S. Cl. .......................... 377/29; 377/44; 377/52; 377/55; 377/112; 307/515; 73/1 R

[58] Field of Search ................ 377/39, 28, 29, 44, 377/55, 111, 114; 328/127; 371/30, 27; 73/1 R, 52, 112; 307/515

[56] References Cited

U.S. PATENT DOCUMENTS

| | | | |
|---|---|---|---|
| 3,308,435 | 3/1967 | Haner et al. | 377/29 |
| 4,093,871 | 6/1978 | Plumb et al. | 377/29 |
| 4,127,091 | 11/1978 | Leichle | 377/47 |
| 4,140,970 | 2/1979 | Graziano | 377/47 |
| 4,220,996 | 9/1980 | Searcy | 377/29 |

Primary Examiner—John S. Heyman
Attorney, Agent, or Firm—Vytas R. Matas; Robert J. Edwards

[57] ABSTRACT

An electronic integrator for integrating a linear voltage signal utilizes a voltage-to-frequency converter for converting the voltage to input frequency. A binary counter counts pulses of the input frequency. The binary counter generates a first operating frequency which is applied to a scaling circuit and another calibration frequency which has a much higher rate than the operating frequency. Both, however are proportional to the input frequency. The scaling circuit scales the operating frequency to a selected extent to form a counting signal. Using the double pole switch, either the calibration frequency or the counting frequency are applied to a pulse counter which is either used to integrate the input voltage signal by counting up pulses of the scaled counting signal, or the integrator can be calibrated using the calibration frequency which quickly increments the pulse counter.

8 Claims, 2 Drawing Figures

ELECTRO-MECHANICAL INTEGRATOR

FIELD AND BACKGROUND OF THE INVENTION

The present invention relates in general to the field of electro-mechanical transducers, and in particular to a new and useful integrator which can be used to integrate linear voltages, such as the linear voltages which correspond directly to a mechanical movement that in turn designates a particular process parameter such as flow rate.

Voltage-to-frequency conversion and totalization techniques are common and well known for use in integrators. A prior integrator known as the Class Y integrator from Bailey Controls, Wickliffe, Ohio, consists of mechanical gears and pivot arms using no electronics. This Bailey Class Y mechanical integrator suffers from various problems such as poor reliability, poor versatility and large parts inventory due to the fact that many versions of the integrator have been provided over the years, mechanical wear resulting in inaccuracy, specialized labor required for assembly and specialized labor required for calibration.

One example of a known transducer which can be used to output a linear voltage signal, is the Bailey Controls Recorder which is designated the Type WM Recorder. These recorders include a pen and pointer which designates a percentage range from 0 to 100% and can be used to measure fluid flow as a process parameter. An integrator can be mechanically coupled to the pointer to provide a running integration of the flow quantity over time.

SUMMARY OF THE INVENTION

An object of the present invention is to provide an electronic integrator which can be used to integrate linear voltage signals over time. The integrator of the present invention is particularly suited to replace the Bailey Class Y mechanical integrator and can be used, for example, with the Bailey Type WM 55 Recorder.

The present invention is in no way limited to the specific applications however. The present invention can be used in any situation requiring totalization (integration) of a rate signal which is linearly related to a mechanical angular rotation. In addition, the inventive device is readily adapted to integration of any linear voltage signal.

The present invention avoids problems of the prior art mechanical integrators in that it has high reliability and versatility, suffers from virtually no mechanical wear and requires relatively unskilled personnel for assembly and calibration.

The present invention can be used for an immediate conversion of mechanical to electrical signals resulting in high reliability that is inherent to electrical signal processing. Adjustable scaling allows one unit to replace most previous integrators. Minimized mechanical parts results in an extended life expectancy. Minimal skill and equipment is necessary for field calibration and the invention results overall in a significant cost reduction.

Accordingly another object of the invention is to provide an electronic integrator for integrating a linear voltage signal over time, comprising input means for applying the linear voltage signal, voltage-to-frequency conversion means for converting the liner voltage signal to an input frequency signal having a frequency proportional to the linear voltage signal, a binary counter connected to said voltage-to-frequency conversion means for counting pulses of the input frequency signal and for generating an operating frequency signal having a relatively low frequency and a calibrating frequency signal having a relatively high frequency with respect to the operating frequency signal, both signals being proportional to the input frequency signal, binary rate multiplying means connected to said binary counter for receiving the operating frequency signal and for producing a counting rate signal, the binary rate multiplying means being presettable for producing a counting rate in the counting rate signal corresponding to a selected scaling factor between the operating frequency signal and the counting rate signal, a pulse counter connected to said binary rate multiplying means for receiving the counting rate signal and counting pulses thereof, the number of pulses indicating a value corresponding to an integration of the linear voltage signal and switch means connected to the binary counter for receiving the calibrating frequency signal, the switch means also being connected to the binary rate multiplying means for receiving the counting rate signal and being connected to the pulse counter, the switch means being selectively positioned for applying one of the counting rate signal and the calibrating frequency signal to the pulse counter.

A further object of the invention is to utilize a plurality of binary rate multipliers which are connected in series, each multiplier being provided with a binary coded digital switch for setting scaling factor in each multiplier.

A still further object of the invention is to provide an electronic integrator which is simple is design, rugged in construction and economical to manufacture while at the same time being easily calibrated and accurate.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which a preferred embodiment of the invention is illustrated.

DESCRIPTION OF THE PREFERRED EMBODIMENT

Figure 1:
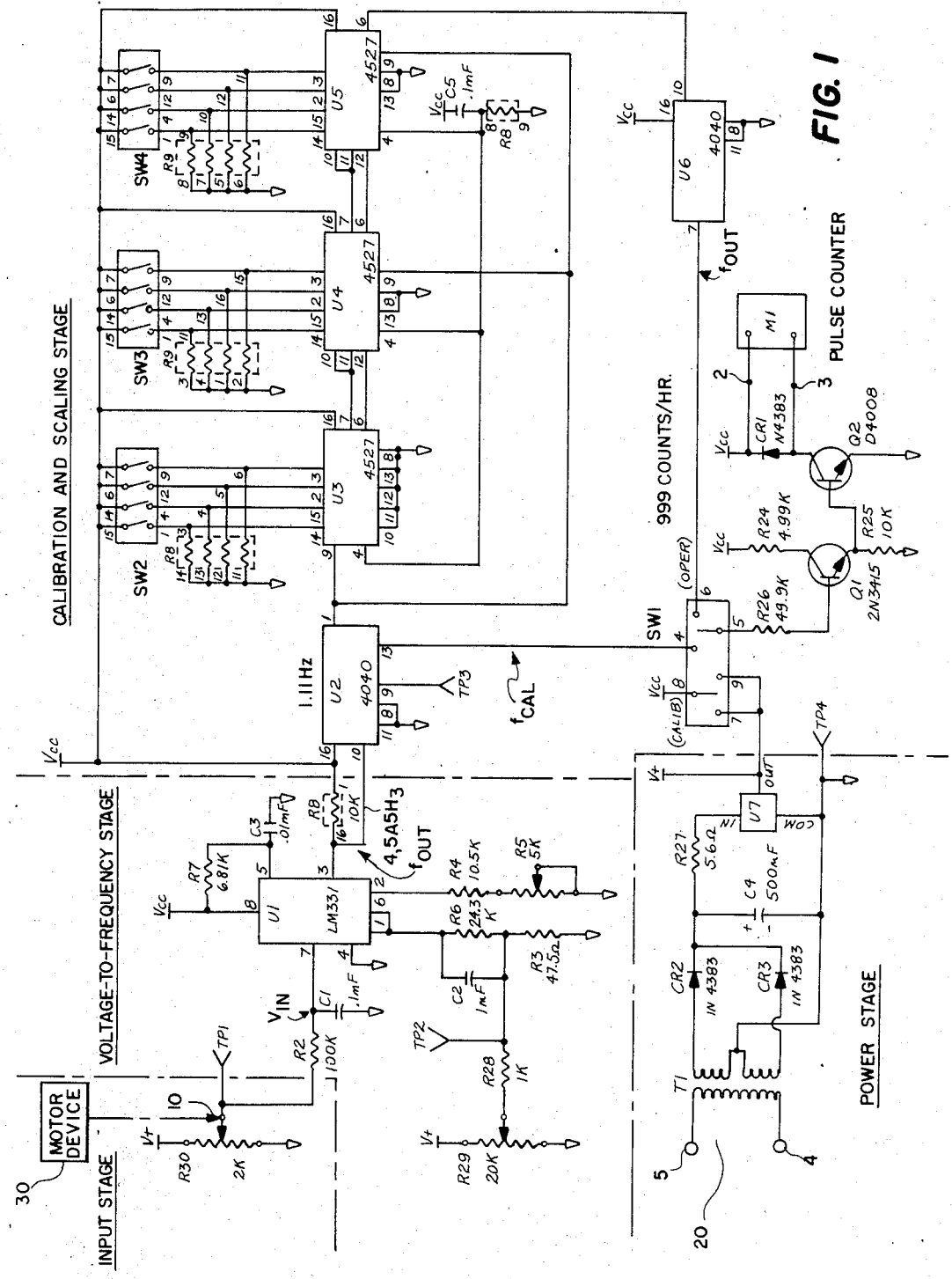
FIG. 1 is a schematic diagram of the circuit for the electronic integrator of the prsent invention.
Figure 2:
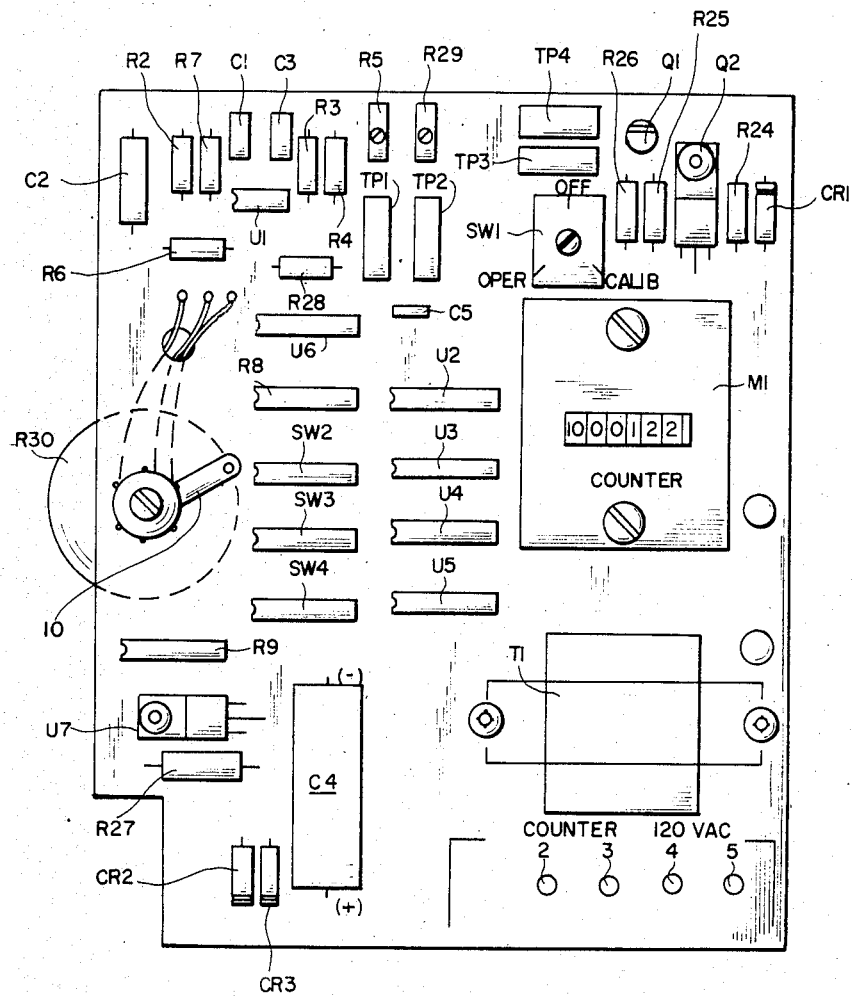
FIG. 2 is a plan view of the layout for components of the circuit in FIG. 1 showing the physical appearance of the electronic integrator.

Referring to FIGS. 1 and 2 in particular, the invention embodied therein comprises an electronic integrator which can be mechanically linked to the movable arm or linkage of a transducer, movement of the arm or linkage being proportional to a process parameter to be measured. The invention can, for example be connected to the moving pointer of a Bailey Type WM 55 Recorder. Such recorders can be used for measuring flow rate and the electronic integrator of the present invention can read the total flow over time and thus integrate the flow signal.

A power supply for the circuit of FIG. 1, comprises the Power Stage and provides a single +12 VDC supply V+, derived from an AC 117 V input 20 to a transformer T1 at terminals 4 and 5. The AC power is rectified by diodes CR2 and CR3 and then filtered and regulated by capacitor C4 resistor R27 and integrated circuit U7 respectively. This provides all of the needed power for the unit.

The Input Stage of the device comprises a potentiometer R30 which has its shaft, and a lever 10 on the shaft, mechanically connected to a linear mechanical motion device 30. The potentiometer R30 has two of its poles connected across the plus and minus supplies to the device (shown as V+ and ground).

A wiper arm of the potentiometer R30 provides an input voltage $V_{IN}$ to the Voltage-To-Frequency (V/F) stage which converts voltage to frequency. This allows for mechanical movement of motion device 30 to be directly converted into an electrical representation of that movement ($V_{IN}$). The Voltage to Frequency stage comprises potentiometers R29 and R5, an LM331 V/F converter U1, resistors R2, R3, R4, R6, R7, R28, part of a resistor array R8 and capacitors C1, C2 and C3, all connected as shown in a FIG. 1. The Voltage-To-Frequency stage receives the linear electrical signal (the voltage $V_{IN}$) and produces a corresponding frequency output $f_{out}$, after proper adjustment of potentiometers R 29 (the zero adjustment) and R5 (the span adjustment). The zero adjustment permits the variations between individual components of the Input Stage to be compensated for.

The zero voltage is the level at which the V/F produces no output pulses if presented with a voltage less than or equal to that of the zero adjustment. The span adjustment sets the voltage from the potentiometer R30 to 1220 mV plus or 10 mV. This corresponds to the maximum span voltage of the integrator illustrated, but could be any voltage within the operating conditions of the LM 331 V/F converter U1 which is used in the Voltage-To-Frequency stage. The frequency output of the LM331 is set by adjusting the R5 to achieve a period of 440±20 microseconds at port TP3 of circuit U2 in the following calibration and scaling. The output of the first stage binary counter U2, as a result of this adjustment, will be a frequency of 1.11 Hz at full scale input from the Input Stage.

The frequency of 1.11 Hz is measured at pin 1 of U2 and serves now as a unique method for establishing a full scale reading of 1.11 Hz for the scaling section of the device. The value of 1.11 Hz is significant in that it will allow the user to input a decimal scaling factor directly by the movement of switches SW2, SW3 and SW4. The calibration accuracy and time it takes to calibrate a device are both improved by using a higher frequency derived on the same circuit U2 for calibration input.

A pin 13 of the circuit U2 provides the output at the frequency $f_{CAL}$ to an output pulse counter M1 through a switch SW1, an an amplifier comprising driver transistors Q1 and Q2, a diode CR1 and resis R24, R25 and R26, all connected as shown, and terminals 2 and 3. This results in count rate on the electromechanical counter M1 calibration within a comparitively short amount of time compared to the normal count rate times of the device in service, which may vary from one to 999 counts per hour as set by the scaling factor. Switch SW1 is a double throw double pole, center OFF switch which either disables the power from the Calibration And Scaling Stage while input V/F adjustments are being made, or is used to put the device in the operate (OPER) or calibrate (CALIB) positions. The calibrate position allows the scaling section to be bypassed and the faster rate output from pin 13 to U2, to be applied to the output counter as described above. The placing of SW1 in the operate position will allow the counter to receive its pulses from the scaling section of the device. This section allows an easy method of scaling an input to read appropriately on the counter of the device.

Rather than a complex set of changeable cams, as employed in the prior mechanical integrator, the present integrator uses binary coded decimal (BCD) switches, namely the switches SW2, SW3 and SW4, to directly input the scaling factor. Each of the switches SW2, SW3 and SW4 is connected to a circuit U3, U4 and U5, respectively, the junctions between respective switch elements of each switch and the associated circuit being connected to ground via respective parts of the resistor array R8 and of a resistor array R9 in the manner shown in FIG. 1. The circuits U3, U4 and U5 are connected in series. Each of the circuits U3, U4 and U5 is a 4527 binary rate multiplier. Entry of a number by the user by means of the switches SW2, SW3 and SW4, in such a manner that the setting of the switch SW2 represents hundreds of units, the setting of the switch SW3 represents tens of units and the setting of the switch SW4 represents units, provides for a scale selection between one and 999. This is to represent the maximum number of units per hour of the integrator for a full scale input. The switches SW2, SW3 and SW4 allow the user to enter a decimal number, and the number is converted by the switches to a BCD format for the binary rate multipliers U3, U4 and U5. The binary rate multiplers U3, U4 and U5 are arranged so that the output of U2 (as calibrated above) is applied as an input to the multiplier U3. Then, an output of the multiplier U3 is presented to the multiplier U4 in proportion to the setting of the switch SW2. An output of the multiplier U3 goes into the multiplier U4 and is proportionately scaled by the setting of the switch SW3. Lastly, the switch SW4 scales the output from the multiplier U4 as it is counted through the mutliplier U5. The result is a scaled output of a frequency which is finally divided by four through a binary counter U6 before being presented to the pulse counter M1 through switch SW1 in its operating (OPER) position.

Pin 4 of each of the multipliers U3, U4 and U5 is connected to the junction of a network comprising a capacitor C5 and part of the resistor array R8.

As shown in FIG. 2 counter M1 has a numeric display for visually displaying a number corresponding to the integrated linear voltage signal $V_{IN}$. FIG. 2 also shows the shaft and arm 10 of the potentiometer R30 which can be mechanically linked to the movable member of a transducer such as the flow recorder mentioned above. FIG. 2 also shows the relative position of the various elements shown in the circuit of FIG. 1.

The particular strength and uniqueness of the present invention resides in the Calibration and Scaling Stage shown in FIG. 1. The Input Stage may be any transduced signal with a linear voltage output and is not limited to a potentiometer per se. The Voltage-To-Frequency Stage is conventional and can be replaced by any equivalent circuit capable of converting a linear voltage into a frequency signal with a frequency proportional to the linear voltage. By using the calibration and scaling circuitry of the present invention, all analog parameters except for the input signal remains static after initial calibration. This means that the output signal $f_{OUT}$ at full scale remains constant regadless of the scale selection using switches SW2, SW3 and SW4. Any calibration method which deviates $f_{OUT}$ can be shown to introduce analog error beyond that of the inventive circuit.

Because the counting rate signal $f_{OUT}$ at full scale is static, it is possible to optimize the counting rate signal with respect to accuracy, linearity and calibration criteria.

Digital scaling results in an overall accuracy which is independent of scale, and the ability to change scales without the need for recalibration.

The full scale frequency of the inventive device may be calibrated to within 0.1% of full scale using only a time reference with accuracy and resolution typical of a common electronic wristwatch including a quartz timer with 0.1 second resolution or better. This last advantage is achieved by making the counting rate signal $f_{OUT}$ significantly larger than a typical calibration interval (e.g. perhaps 1 to 5 minutes). The overriding source of error thus becomes the uncertainty in the interval itself.

All of the advantages set forth above are achieved through the use of the circuitry shown in FIG. 1. The double throw switch SW1 is used for calibration. This makes the design very cost efficient yet still versatile. The device can be calibrated utilizing a common wristwatch and this enhances its value for use in field applications. In other words when the switch SW1 is switched over to its calibration position (CALIB) the high frequency signal $f_{CAL}$ is applied to the pulse counter M1, changing the numerical display of the counter rapidly. Calibration is achieved by observing the count of the counter and checking the time it takes to reach that count. Adjustment can be made using the zero set and scale set potentiometers R29 and R5 in the Voltage-To-Frequency Stage.

The input stage may any transducer or structure which generates a useful linear voltage signal. Any Voltage-To-Frequency converter can replace the one shown and the signal $F_{OUT}$ can be optimized for the particular coverter used.

These circuits U2 through U6 are digital counters and can be represented in general by the transfer functions:

$f_{OUT} = n/m(f_{OUT})$ where n and m are integers m is greater than or equal to n; and $f_{CAL} = k(f_{OUT})$ where k is an integer and is useful in the case where k is much greater than n/m for the purpose of calibration.

In FIG. 1, the connections TP1 through TP4 are used during installation of the integrator to help make an initial settings for an initial calibration of the integrator to suit a particular transducer. For example, when using the inventive integrator with the Type WM55 Recorder, a volt meter having 0.1 mV accuracy is connected at TP1 as the + terminal and TP4 as the −terminal. The Input Stage potentiometer R30 is then turned until a reading of 200 mV±50 mV is reached. This procedure is followed with the calibration switch SW1 to its neutral or OFF position. Power is thus removed from all circuitry except for the input and zero potentiometers R29 and R30. This sets an initial position for the lever 10 which can then be secured to the shaft of the potentiometer R30. The negative volt meter probe can then be moved from connection TP4 to connection TP2. In this position, potentiometer R29 is rotated until a reading of −3 mV,±1 mV, is read on the volt meter.

Inputs of 50% and 100% are then applied artificially by rotating the lever 10 and the voltage measurements are recorded. If the voltage span from 0 to 50% is less than the voltage span from 50 to 100% by more than 10 mV, an adjustment must be made in the linkage between the lever arm 10 and the pointer of the recorder (not shown). Similar adjustments are necessary if the span from 0 to 50% is greater than the span from 50 to 100% by more than 10 mV.

To calibrate the integrator once the lever arm 10 and potentiometer R29 has been set as noted above, switch SW1 is switched to its calibration position for 15 seconds. Beforehand a notation is taken of the number indicated in the display of counter M1. The 15 seconds can be verified using a quartz watch with a sweeping second hand. After 15 seconds return switch SW1 to its neutral or OFF position. With the switch SW1 in the calibration position, the counter operates at high frequency using the signal $f_{CAL}$ from counter U2.

The count now appearing on counter M1 is then recorded and subtracted from the previous reading to give the count rate for the 15 second period. If the count rate is less than 133 the range potentiometer R5 is rotated clockwise to increase the counting speed. If the rate is less than 133 the potentiometer R5 is turned counterclockwise to decrease the speed.

For a course adjustment, the foregoing steps are repeated until a 15 second count of 133±1 is achieved.

For a finer adjustment a longer period can be taken, for example a count of 533±1 should result if the switch SW1 is placed in the calibration position for 60 seconds.

As noted above, the scale is selected by manipulting switches SW2, SW3 and SW4, each being in the BCD format so that each can be switched for providing a number from 0 to 9 and thus from 100 to 900 for multiplier U3, from 10 to 90 for multiplier U4 and from 1 to 9 for multiplier U5.

While specific embodiment of the invention has been shown and described in detail to illustrate the application of the principles of the invention, it will be understood that the invention may be embodied otherwise without departing from such principles.

What is claimed is:

1. An electronic integrator for integrating a linear voltage signal over time, comprising:
   input means for applying the linear voltage signal;
   voltage-to-frequency conversion means for converting the linear voltage signal to an input frequency signal having a frequency proportional to the linear voltage signal;
   a binary counter connected to said converter for counting pulses of the input frequency signal and for generating an operating frequency signal having a relatively low frequency, and a calibrating frequency signal having a relatively high frequency with respect to the operating frequency signal;
   binary rate multiplying means connected to said binary counter for receiving the operating frequency and for generating a counting rate signal which has pulses that are at a scaled proportion of the operating frequency signal, said binary rate multiplying means having scaling means for changing the proportion;
   a pulse counter for counting pulses of the counting rate signal and for counting pulses of the calibrating frequency signal; and switch means having a first input connected to said binary counter for receiving the calibrating frequency signal, a second input connected to said binary rate multiplying means for receiving the counting rate signal, and an output connected to said pulse counter, said switch means being selectively switchable between a calibration position connecting said first input to said pulse counter for incrementing the pulse counter rapidly, and an operating position connecting said second input to said pulse counter for incrementing said pulse counter more slowly and at a rate proportional to the linear voltage signal.

2. An integrator according to claim 1, wherein said pulse counter has a numeric display for displaying the count of the pulse counter, said numeric display changing more rapidly when said switch means is in its calibration position than when said switch means is in its operating position.

3. An integrator according to claim 2, wherein said switch means comprises a double throw switch having a neutral off position where neither of said first and second inputs are connected to said output.

4. An integrator according to claim 3, wherein said double throw switch comprises a double pole double throw switch having additional inputs and an additional output, a power supply connected to said additional inputs, said additional output being connected to said pulse counter for powering said pulse counter, said switch in its off position supplying no power to said pulse counter.

5. An integrator according to claim 4, wherein said binary rate multiplying means comprises a plurality of binary rate multipliers connected in series, a first one of said multipliers in said series being connected to said binary counter for receiving the operating frequency signal and a last one of said multipliers in said series having an output, and an additional binary counter connected between said output of said last multiplier and said second input of said switch means.

6. An integrator according to claim 5, wherein said pulse counter includes amplifying means connected to said output of said switch means for amplifying the counting rate signal and the calibrating frequency signal, said amplifying means having a power input connected to said additional output of said double pole double throw switch.

7. An integrator according to claim 1, wherein said switch means comprises a double throw switch having a neutral off position where neither of said first and second inputs are connected to said output.

8. An integrator according to claim 1, wherein said binary rate multiplying means comprises a plurality of binary rate multipliers connected in series, a first one of said multipliers in said series being connected to said binary counter for receiving the operating frequency signal and a last one of said multipliers in said series having an output, and an additional binary counter connected between said output of said last multiplier and said second input of said switch means.

* * * * *